(12) United States Patent
Chan et al.

(10) Patent No.: US 7,465,644 B1
(45) Date of Patent: Dec. 16, 2008

(54) ISOLATION REGION BIRD'S BEAK SUPPRESSION

(75) Inventors: Simon S. Chan, Saratoga, CA (US); Weidong Qian, Sunnyvale, CA (US); Scott Bell, San Jose, CA (US); Phillip Jones, Fremont, CA (US); Allison Holbrook, San Jose, CA (US)

(73) Assignees: Advanced Micro Devices, Inc., Sunnyvale, CA (US); Spansion LLC, Sunnyvale, CA (US)

( * ) Notice: Subject to any disclaimer, the term of this patent is extended or adjusted under 35 U.S.C. 154(b) by 405 days.

(21) Appl. No.: 11/258,209

(22) Filed: Oct. 26, 2005

(51) Int. Cl.
*H01L 21/76* (2006.01)

(52) U.S. Cl. ............... 438/439; 438/424; 257/E21.546

(58) Field of Classification Search ............... 438/424, 438/439; 257/E21.546
See application file for complete search history.

(56) References Cited

U.S. PATENT DOCUMENTS

| 6,468,865 | B1* | 10/2002 | Yang et al. | 438/262 |
| 7,202,128 | B1* | 4/2007 | Orimoto et al. | 438/257 |
| 2006/0035418 | A1* | 2/2006 | Yoshida et al. | 438/149 |

* cited by examiner

*Primary Examiner*—Bradley K Smith
(74) *Attorney, Agent, or Firm*—Harrity & Harrity LLP

(57) ABSTRACT

A structure for electrically isolating semiconductor devices includes a semiconducting layer and a layer of aluminum oxide formed in a pattern over the semiconducting layer, where the pattern exposes a portion of the semiconducting layer. The structure further includes an electrical isolation region formed in the exposed portion of the semiconducting layer, where the isolation region does not substantially encroach a region beneath the layer of aluminum oxide.

24 Claims, 10 Drawing Sheets

ISOLATION REGION BIRD'S BEAK SUPPRESSION

TECHNICAL FIELD

The present invention relates generally to semiconductor devices and, more particularly, to the suppression of the formation of "bird's beaks" when forming electrical isolation regions in semiconductor devices.

BACKGROUND ART

During the fabrication of semiconductor devices, it is common to form electrical isolation regions upon the semiconductor substrate to isolate certain semiconductor devices from one another. Isolation of the semiconductors devices from one another reduces detrimental effects, such as, for example, parasitic effects and cross-talk effects. Typically, a local oxidation of silicon (LOCOS) technique is used, in conjunction with a nitride mask, to create isolation regions on a semiconductor substrate. As shown in FIG. 1A, a nitride mask 110 may be formed over a substrate 105 to leave an area 115 in which substrate 105 is exposed. A LOCOS oxidation technique may then be used, as shown in FIG. 1B, to create an oxide isolation region 120 in the substrate 105 in area 115. The isolation region 120 may include, for example, silicon dioxide ($SiO_2$). As further shown in FIG. 1B, a conventional LOCOS technique produces "bird's beaks" 125 at the edges of the isolation region 120. Nitride mask 110 may bend upwards and the oxide of the isolation region 120 may substantially encroach beneath mask 110, thereby deforming nitride mask 110. Conventional LOCOS techniques, thus, lead to undesirable oxide encroachment beneath the mask 110.

DISCLOSURE OF THE INVENTION

Consistent with aspects of the invention, a layer of aluminum oxide (e.g., $Al_2O_3$) may be used, instead of a nitride layer, for masking a portion of a substrate prior to a LOCOS oxidation process used to form electrical isolation regions between portions of a semiconductor substrate. Formation of electrical isolation regions, using a layer of aluminum oxide as an oxidation mask, suppresses the formation of "bird's beaks" in the corners of the isolation regions that substantially encroach beneath the aluminum oxide layer and, thus, substantially reduces the deformation of the aluminum oxide layer, and any other layer adjacent the aluminum oxide layer.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a method that may include forming a layer of $Al_2O_3$ over a semiconducting layer and etching a pattern in the layer of $Al_2O_3$ to expose portions of the semiconducting layer. The method may further include oxidizing at least one of the exposed portions of the semiconducting layer to form an electrical isolation region.

According to another aspect of the invention, a structure for electrically isolating semiconductor devices may include a semiconducting layer and a layer of aluminum oxide formed in a pattern over the semiconducting layer, where the pattern exposes a portion of the semiconducting layer. The structure may further include an electrical isolation region formed in the exposed portion of the semiconducting layer, where the isolation region does not substantially encroach a region beneath the layer of aluminum oxide.

According to a further aspect of the invention, a method of forming an electrical isolation region on a semiconductor substrate may include forming a layer of aluminum oxide over the semiconductor substrate in a pattern, where the pattern exposes a portion of the semiconductor substrate. The method may further include locally oxidizing the exposed portion of the semiconductor substrate to form an electrical isolation region, where the isolation region does not substantially encroach an area beneath the layer of aluminum oxide.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Figure 1B:
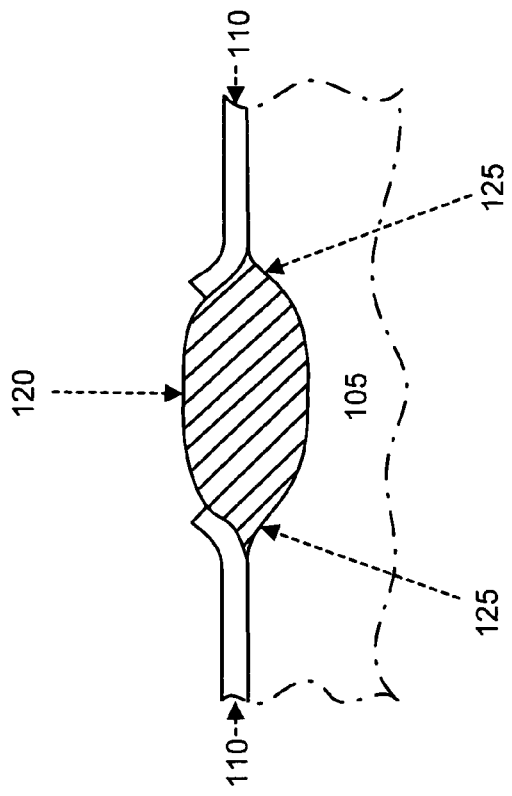
FIGS. 1A & 1B illustrate the formation an electrical isolation region in a semiconductor substrate using existing LOCOS oxidation techniques.
Figure 1A:
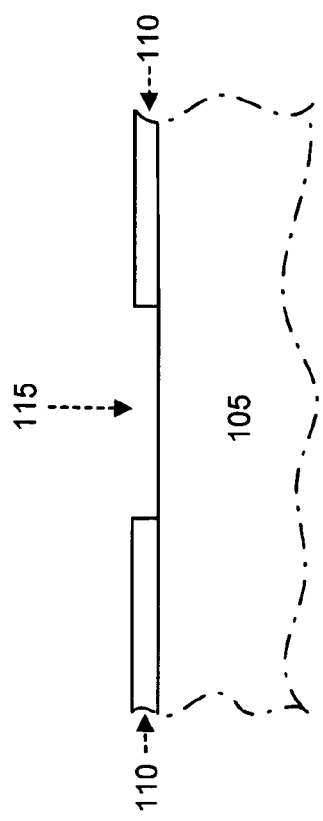
Figure 2:
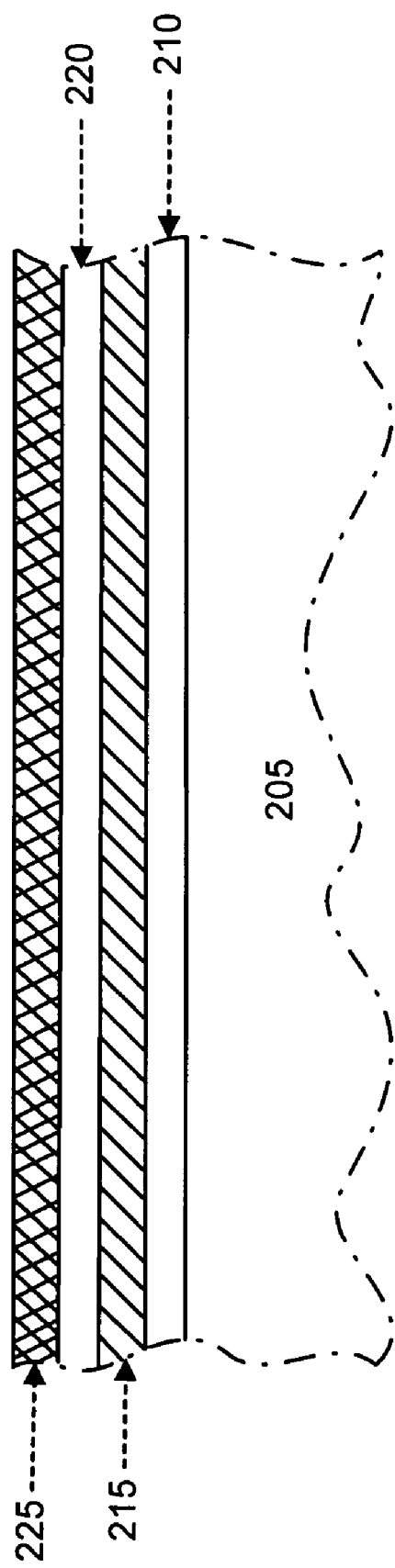
FIG. 2 illustrates the formation of a layer of aluminum oxide upon a layered stack consistent with an aspect of the invention.

FIG. 2 illustrates a cross-section of a semiconductor substrate 205 according to an exemplary embodiment of the invention. Substrate 205, consistent with one aspect, may include a crystal silicon wafer. In other implementations, substrate 205 may include a gallium arsenide layer, a silicon-on-insulator structure, a germanium layer, a silicon-germanium layer, or other conventional materials used to form a semiconductor substrate. A bottom oxide layer 210 may be formed on substrate 205. Bottom oxide layer 210 may be formed on substrate 205 using, for example, existing deposition processes, such as a chemical vapor deposition (CVD) process. Bottom oxide layer 210 may include oxide materials, such as, for example, silicon oxide (e.g., $SiO_2$), or silicon oxynitride. The thickness of bottom oxide layer 210 may range, for example, from about 30 Å to about 100 Å.

A charge storage layer 215 may be formed on bottom oxide layer 210 using, for example, existing deposition processes, such as conventional CVD processes. In one exemplary embodiment, charge storage layer 215 may include a nitride charge storage layer, such as, for example, silicon nitride (e.g., $Si_3N_4$). In other embodiments, charge storage layer 215 may include other known dielectric materials that may be used to store a charge. The thickness of charge storage layer 215 may range, for example, from about 40 Å to about 120 Å. In other embodiments, charge storage layer 215 may include a conductive material, such as polycrystalline silicon, used to form a floating gate electrode.

A top oxide layer 220 may be formed on charge storage layer 215. Top oxide layer 220 may be formed on charge storage layer 215 using, for example, existing deposition processes, such as a CVD process. Top oxide layer 220 may include oxide materials, such as, for example, silicon oxide, or silicon oxynitride. The thickness of top oxide layer 220 may range, for example, from about 30 Å to about 130 Å.

A layer 225 of material may be formed on top oxide layer 220. Layer 225 may be formed on top oxide layer 220 using, for example, existing deposition processes, such as a CVD process. Layer 225 may include an aluminum oxide (e.g., $Al_2O_3$), though other materials, such as, for example, $HfO_2$ or $Ta_2O_5$ may be used. The thickness of layer 225 may range, for example, from about 40 Å to about 150 Å.

Figure 3:
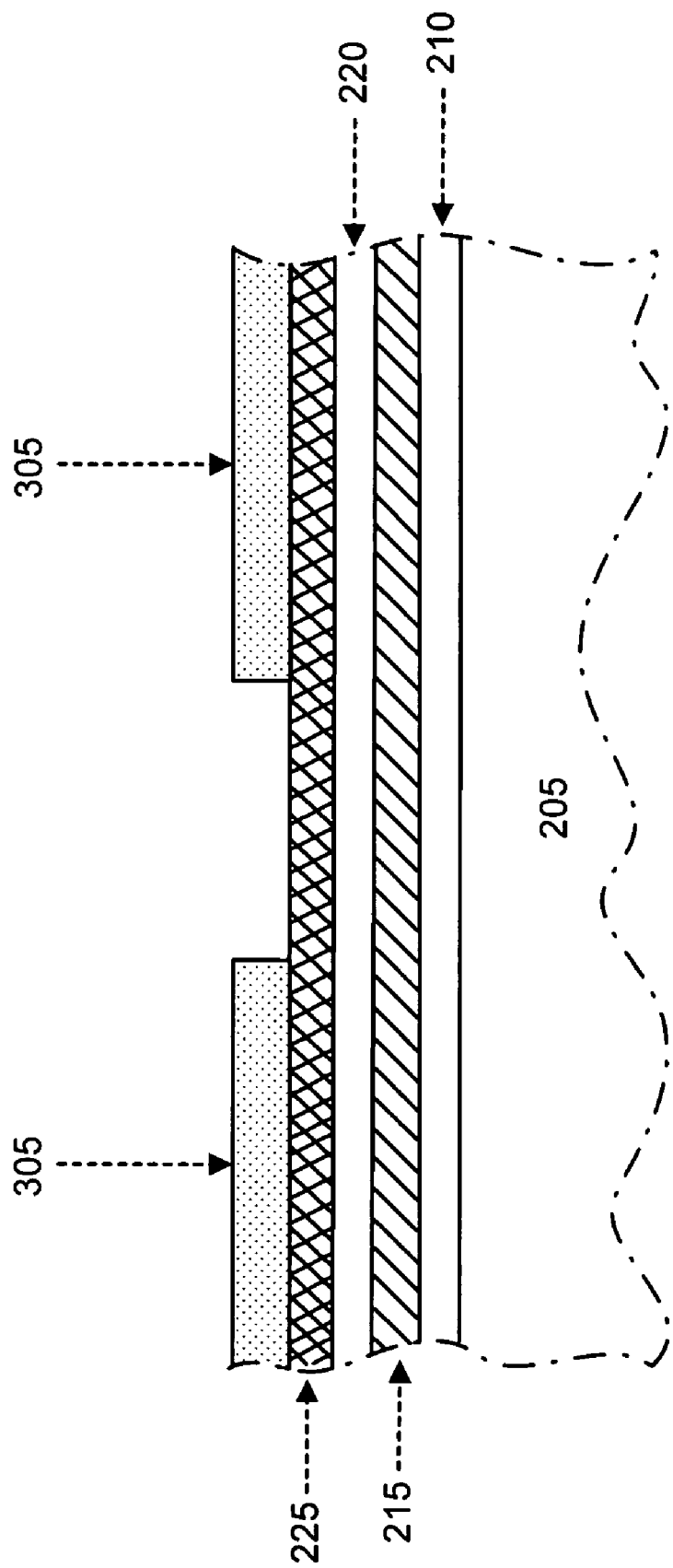
FIG. 3 illustrates the formation of a mask 305 upon the aluminum oxide layer of FIG. 2 consistent with an aspect of the invention.
Figure 4:
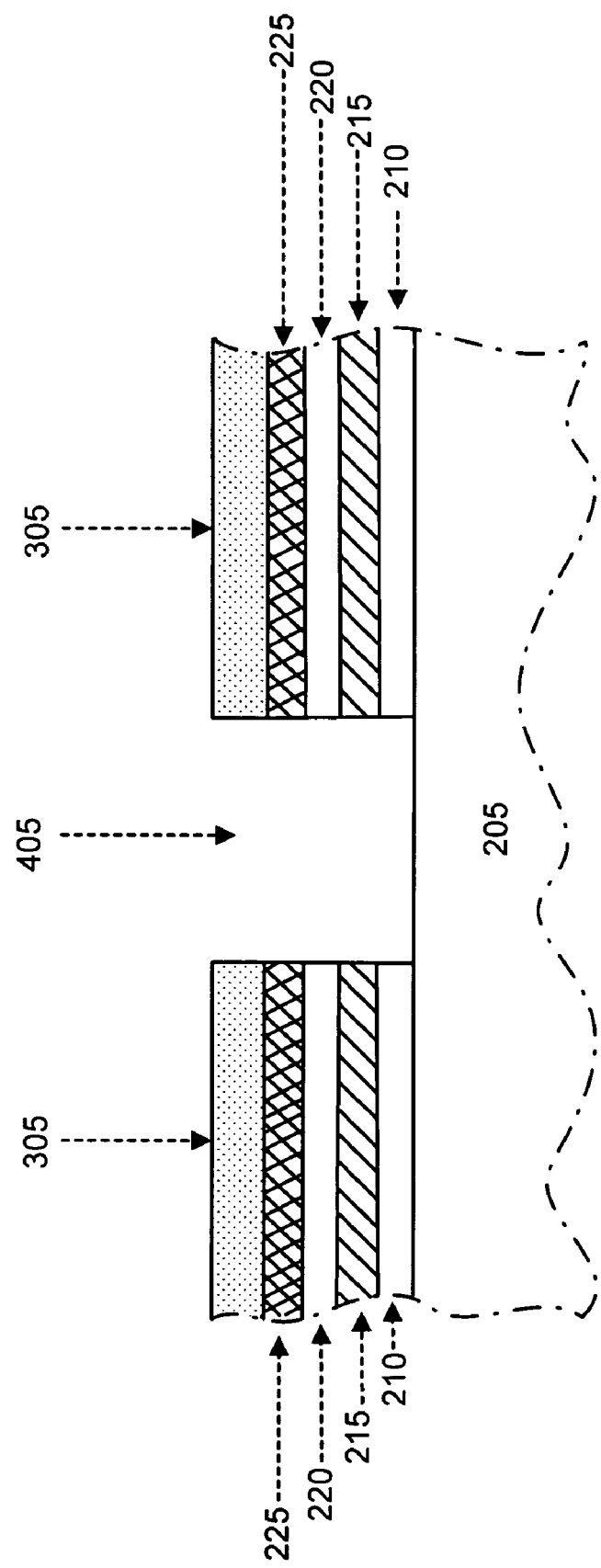
FIG. 4 illustrates etching of the layers of FIG. 3 to expose an area of the substrate consistent with an aspect of the invention.

As shown in FIG. 3, a mask 305 may be formed on layer 225 in a pattern that corresponds to the desired size and location of the eventually formed electrical isolation region. Mask 305 may be formed using existing photolithographic techniques. As shown in FIG. 4, after formation of mask 305, the exposed portions of layers 225, 220, 215 and 210 may be etched away, with the etch terminating at substrate 205, to create a trench 405. Existing etching processes may be used to etch layers 225, 220, 215 and 210 to create trench 405.

Figure 5:
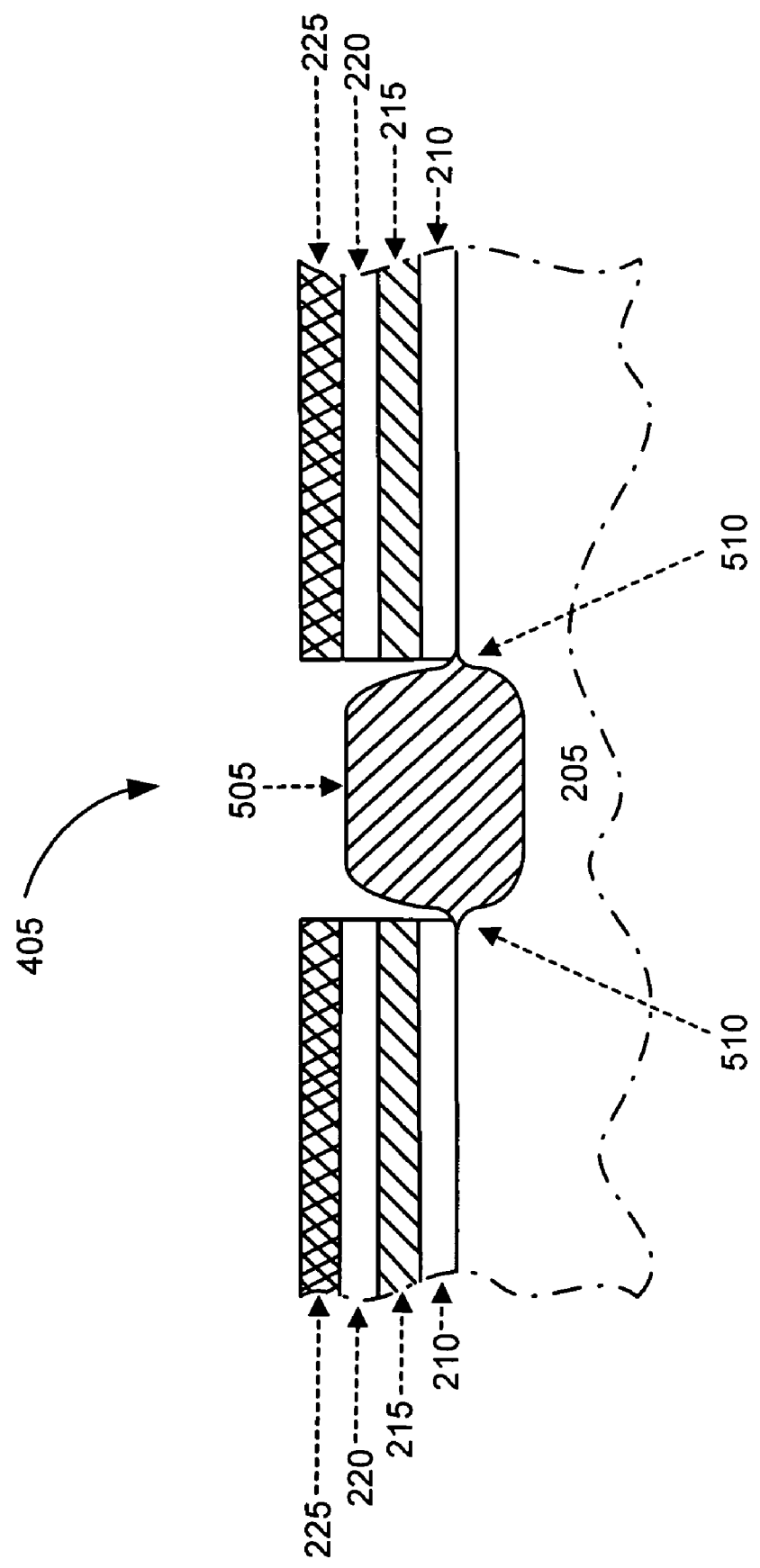
FIG. 5 illustrates the formation of an electrical isolation region consistent with an aspect of the invention.

As shown in FIG. 5, mask 305 may be removed using existing etching or stripping processes. An isolation region 505 may then be formed in substrate 205 in trench 405 using layer 225 as an oxidation mask. Isolation region 505 may be formed in substrate 205 using existing LOCOS techniques. Isolation region 505 may include, for example, $SiO_2$, though other oxide materials may be used. The thickness of isolation region 505 may range, for example, from about 200 Å to about 1500 Å. As can be seen in FIG. 5, the "bird's beaks" 510 formed in corners of isolation region 505 during LOCOS processing according to the present invention do not substantially encroach beneath layers 210, 215, 220 or 225, and do not result in any substantial deformation of layers 210, 215, 220 or 225. Formation of isolation region 505 in trench 405, with layer 225 formed on top of layers 210, 215 and 220 as an oxidation mask, thus, serves to prevent encroachment of isolation region 505 beneath layers 210, 215 and 220 during LOCOS processing.

Figure 6:
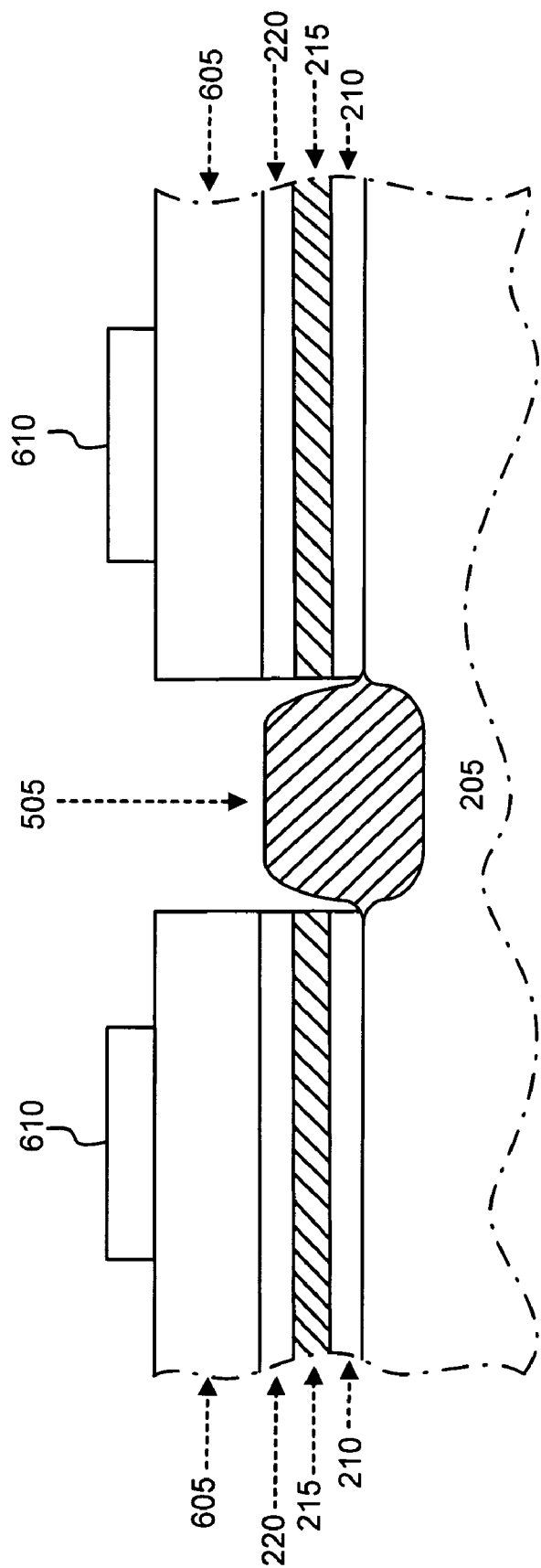
FIG. 6 illustrates the formation of a gate electrode layer and a gate mask upon the layers of FIG. 5 consistent with an aspect of the invention.

Layer 225 may then be removed using existing etching or stripping processes, as shown in FIG. 6. A gate electrode layer 605 may then be formed on layer 220. Gate electrode layer 605 may be formed on layer 220 using, for example, existing deposition processes, such as a CVD process. Gate electrode layer 605 may include, for example, polysilicon, or a metal such as tantalum or titanium. The thickness of layer 605 may range, for example, from about 500 Å to about 2500 Å. A mask 610 may be formed on gate electrode layer 605. Mask 610 may be formed using existing photolithographic techniques.

Figure 7:
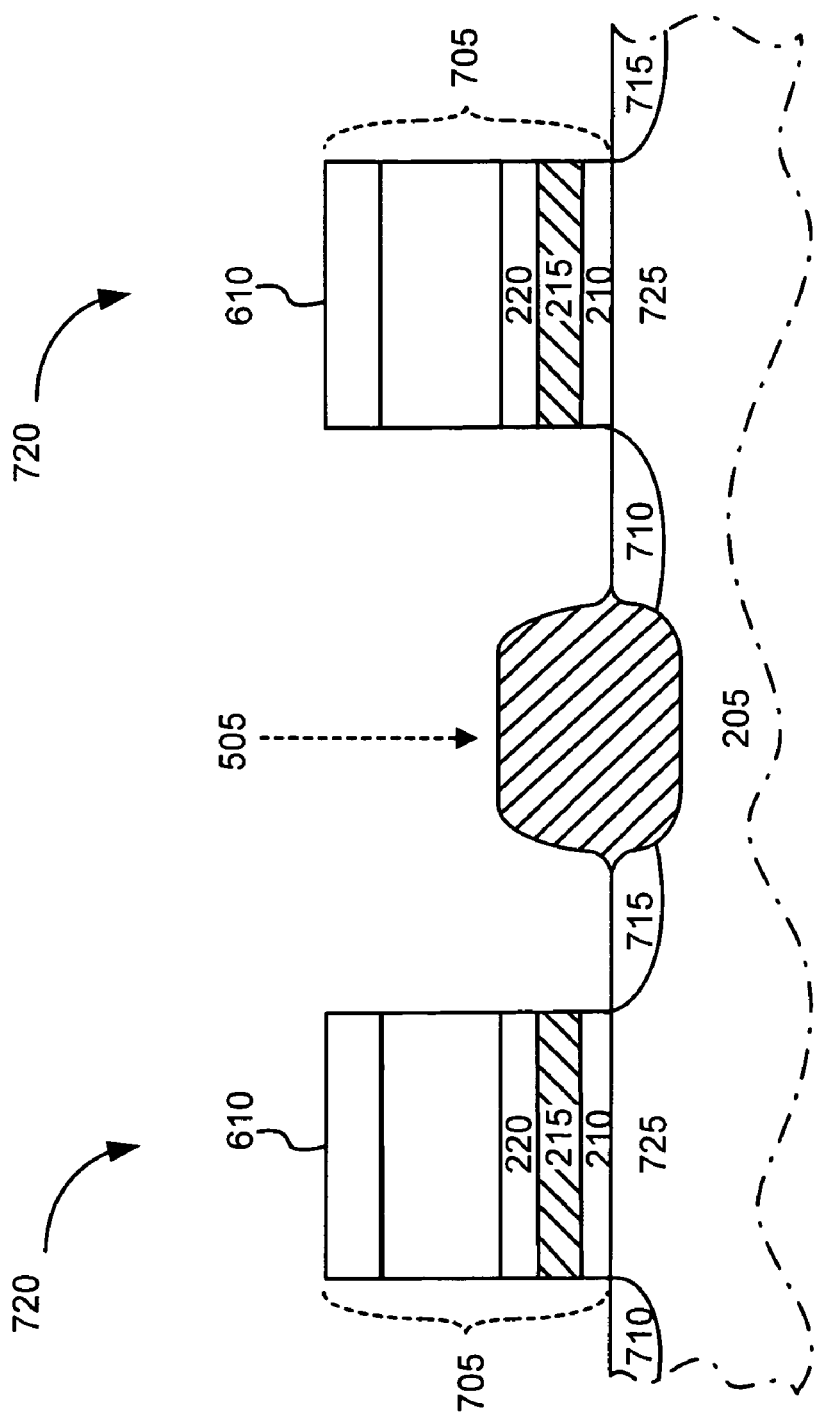
FIG. 7 illustrates etching of the layers of FIG. 6 to form gate structures consistent with an aspect of the invention.

As shown in FIG. 7, layers 210, 215, 220 and 605 may, in one exemplary embodiment, be etched, using existing etching processes, to form gate structures 705. A source region 710 and a drain region 715 may then be formed in substrate 205, on each side of the gate structures 705, as shown in FIG. 7, to form respective devices 720, such as SONOS type memory devices. Each source region 710 and drain region 715 may be doped with n-type or p-type impurities based on particular end device requirements. The particular implantation dosages and energy used to implant the impurities is not described herein in order not to unduly obscure the thrust of the invention. One of ordinary skill in the art, however, would be able to optimize the formation of each source region 710 and drain region 715 based on the particular end device requirements. Formation of each source region 710 and drain region 715 creates a channel region 725 in substrate 205 between a respective source region 710 and drain region 715.

Figure 8:
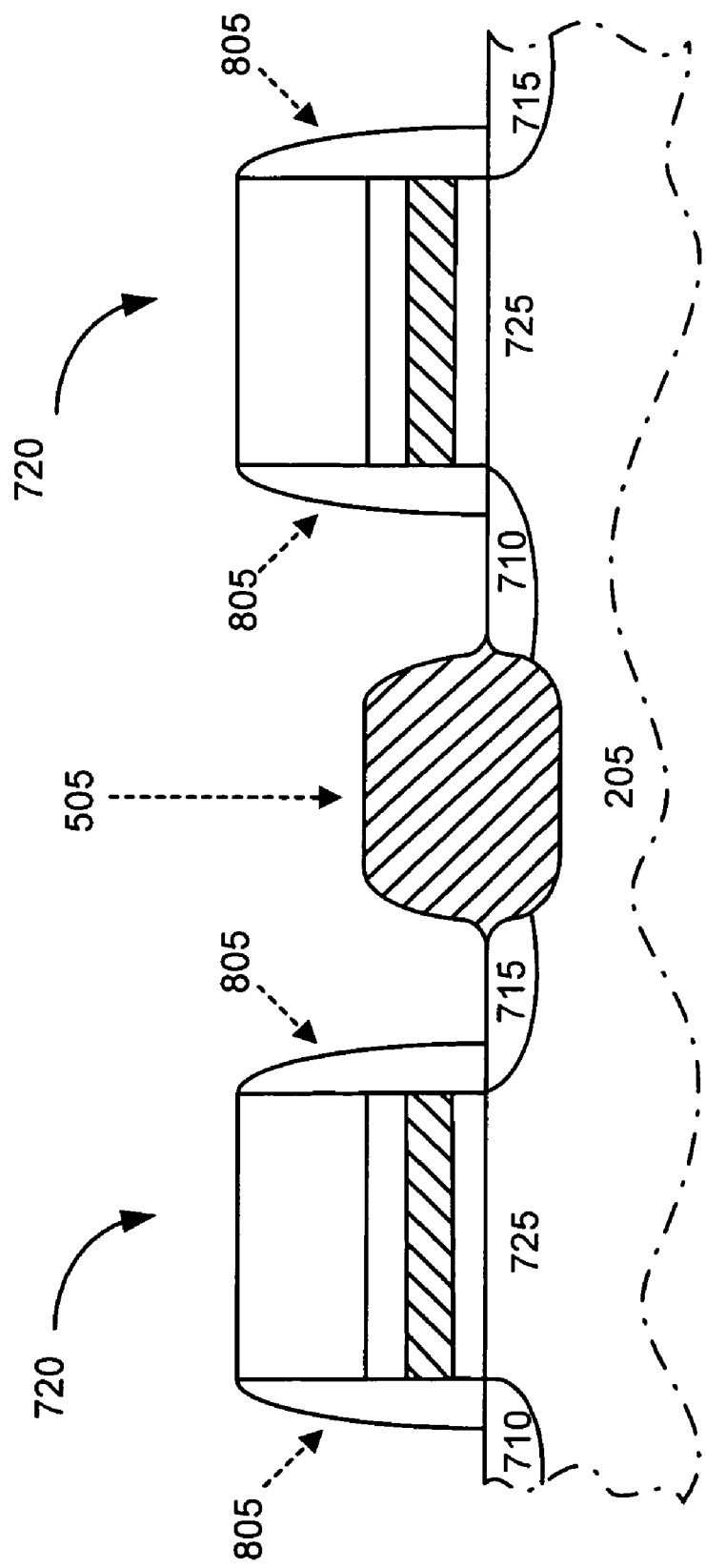
FIG. 8 illustrates the formation of spacers adjacent the gate structures of FIG. 7 consistent with an aspect of the invention.

In some implementations, sidewall spacers 805 may then be formed adjacent the vertical side surfaces of each gate structure 705, as shown in FIG. 8. Spacers 805 may be formed of a dielectric material such as silicon oxide or silicon nitride. The width and height of spacers 805 may be optimized based on the end device requirements. In other exemplary embodiments, each device 720 may be formed with planar structures, without sidewall spacers 805, where layers of the device 720 may extend continuously. In such embodiments, source and drain regions may be formed with implants going through the dielectric layers.

Figure 9:
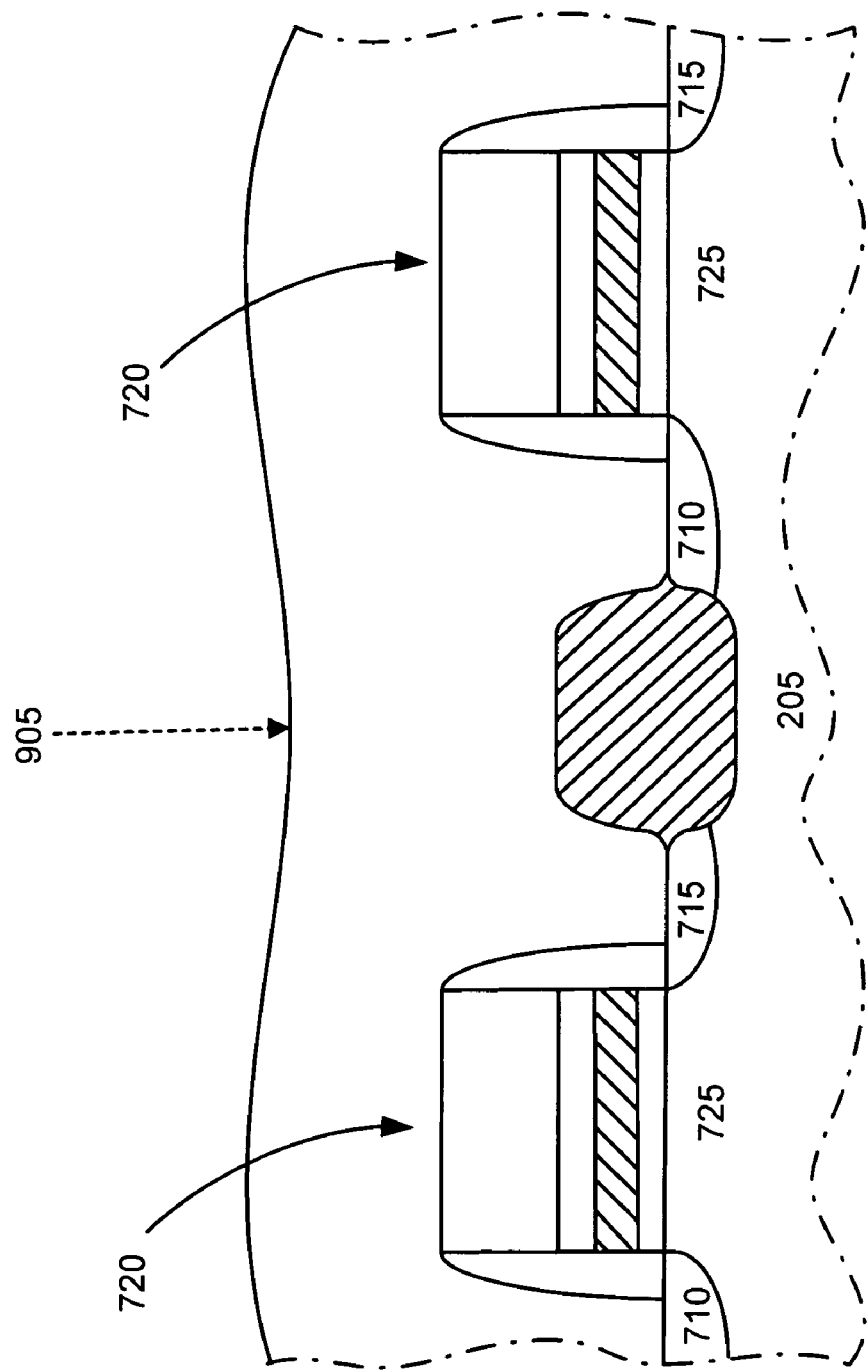
FIG. 9 illustrates the formation of an interlayer dielectric over the gate structures of FIG. 8 consistent with an aspect of the invention.

As shown in FIG. 9, an interlayer dielectric (ILD) 905 may be formed over the devices 720. ILD 905 may be formed over the devices 720 using, for example, existing deposition processes. ILD 905 may include, for example, tetraethylorthosilicate (TEOS), or any other dielectric material. In one exemplary implementation, ILD 905 may include a borophosphorous TEOS (BPTEOS). The thickness of ILD 905 may vary based on the size of devices 720, or based on other design or fabrication parameters. In one exemplary embodiment, the thickness of ILD 905 may range from about 5000 Å to about 15000 Å.

Figure 10:
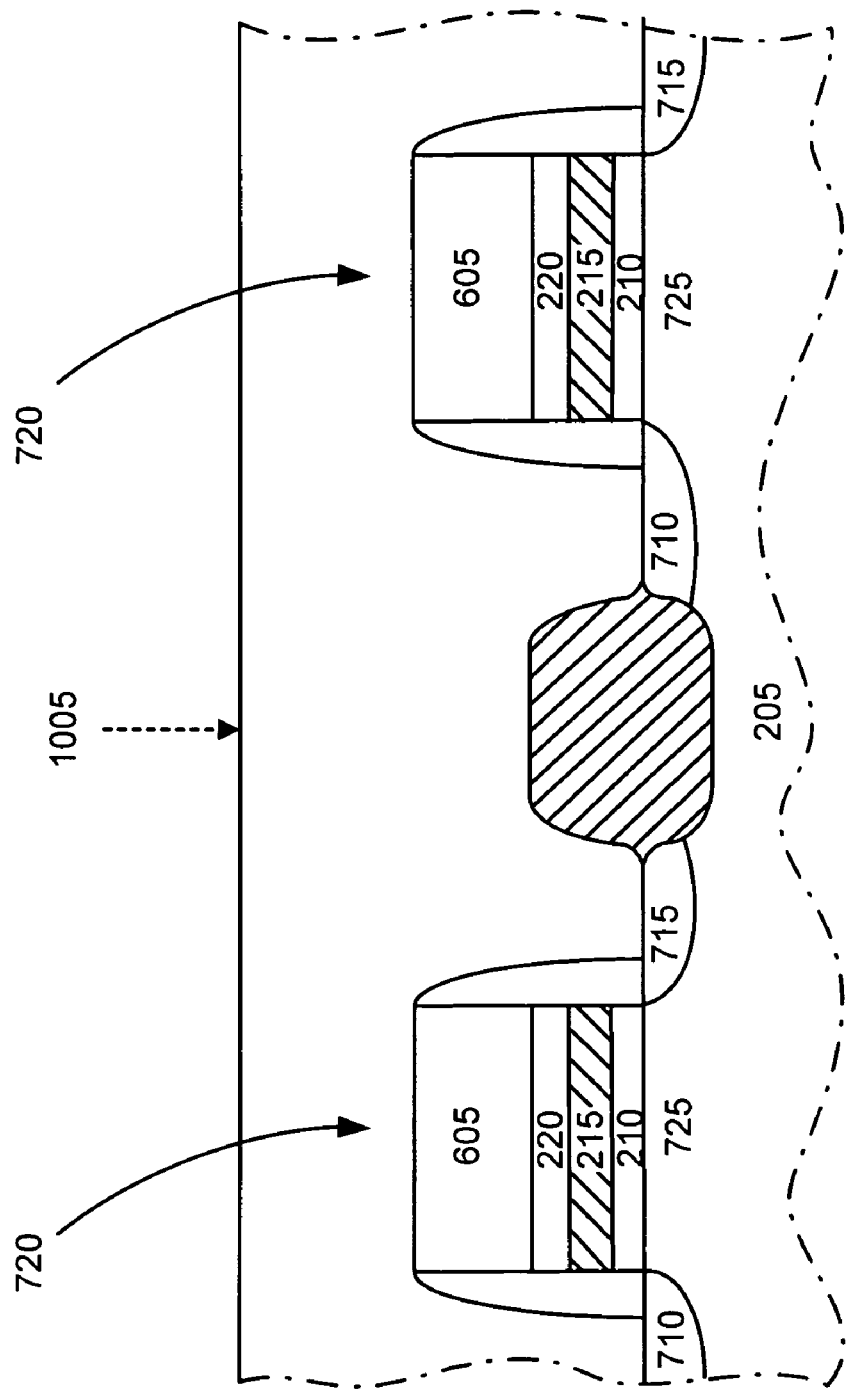
FIG. 10 illustrates the planarization of the interlayer dielectric of FIG. 9 consistent with an aspect of the invention.

As shown in FIG. 10, ILD 905 may be polished back to a planar surface 1005 using, for example, an existing chemical-mechanical polishing (CMP) process. One or more vias (not shown) may then be formed in ILD 905, followed by deposition of a metal, such as copper, aluminum or tungsten, to form one or more contacts. An interconnect structure may then be formed to interconnect different components of a device 720, or to interconnect each device 720 with other devices (not shown).

In an exemplary implementation, each device 720 illustrated in FIG. 10 may represent a single memory cell in a non-volatile memory device, such as an electrically erasable programmable read only memory (EEPROM) device. During operation of device 720, voltages may be applied to gate electrode 605, source region 710 and drain region 715. The applied voltages may cause electrical charge from source region 710 and drain region 715 to propagate across channel region 725 and to tunnel from channel region 725 through bottom oxide layer 210 for retention in charge storage layer 215. The layered stack structure 705 that includes bottom oxide layer 210, charge storage layer 215 and top oxide layer 220 permits channel erase in each device 720, where charge in gate electrode 605 may be discharged via channel region 725.

In an exemplary implementation consistent with the invention, each memory device 720, as illustrated in FIG. 10, may include a single memory cell that may be configured to store two bits of data. That is, charge storage layer 215 may be programmed to store two separate bits of data by localizing the first and second charges to the respective left and right sides of charge storage layer 215 illustrated in FIG. 10. For example, each of the two bits of memory device 720 may be programmed independently by, for example, channel hot electron injection, to store a charge representing a bit on each respective side of the charge storage layer 215. In this manner, the charges in charge storage layer 215 become effectively trapped on each respective side of charge storage layer 215. During erasing, the charges stored in charge storage layer 215 may tunnel through bottom oxide layer 210 into the source region 710 and drain region 715, respectively.

In this manner, the density of an array of multiple memory devices 720 may be increased as compared to conventional memory devices that store only one bit of data per cell. In alternative implementations, each memory device 720 may be configured to store one bit of data per memory device 720.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

The foregoing description of embodiments of the present invention provides illustration and description, but is not intended to be exhaustive or to limit the invention to the precise form disclosed. Modifications and variations are possible in light of the above teachings or may be acquired from practice of the invention. For example, while series of acts have been described above, the order of the acts may vary in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein. No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the following claims and their equivalents.

What is claimed is:

1. A method, comprising:
    forming a first layer of oxide over a semiconducting layer;
    forming a layer of nitride over the first layer;
    forming a second layer of oxide over the nitride layer;
    forming a layer of $Al_2O_3$, $HfO_2$ or $Ta_2O_5$ over the second layer of oxide;
    etching a pattern in the layer of $Al_2O_3$, $HfO_2$ or $Ta_2O_5$ to expose portions of the semiconducting layer; and
    oxidizing at least one of the exposed portions of the semiconducting layer, using an oxidation process, to form an electrical isolation region, where the oxidation process directly oxidizes the at least one of the exposed portions of the semiconducting layer without oxidizing through any other intervening layers.

2. The method of claim 1, wherein the layer of $Al_2O_3$, $HfO_2$ or $Ta_2O_5$ has a thickness ranging from about 40 Å to about 150 Å.

3. The method of claim 1, wherein the isolation region has a thickness ranging from about 200 Å to about 1500 Å.

4. The method of claim 1, wherein the semiconducting layer comprises silicon and wherein the isolation region comprises a silicon oxide.

5. The method of claim 1, wherein the semiconducting layer comprises silicon and where the oxidation process comprises:
    a local oxidation of silicon (LOCOS) process.

6. The method of claim 1, wherein the isolation region does not substantially encroach a region beneath the layer of $Al_2O_3$, $HfO_2$ or $Ta_2O_5$.

7. The method of claim 1, wherein the isolation region does not substantially deform the layer of $Al_2O_3$, $HfO_2$ or $Ta_2O_5$.

8. A structure for electrically isolating semiconductor devices, comprising:
    a semiconducting layer;
    a first layer of oxide formed directly on the semiconducting layer;
    a layer of nitride formed directly on the first layer;
    a second layer of oxide formed directly on the nitride layer;
    a layer of $Al_2O_3$, $HfO_2$ or $Ta_2O_5$ formed in a pattern directly on the second layer, where the pattern exposes a portion of the semiconducting layer; and
    an electrical isolation region formed in the exposed portion of the semiconducting layer, wherein the isolation region does not substantially encroach a region beneath the layer of $Al_2O_3$, $HfO_2$ or $Ta_2O_5$.

9. The structure of claim 8, wherein the isolation region has a thickness ranging from about 200 Å to about 1500 Å.

10. The structure of claim 8, wherein the layer of $Al_2O_3$, $HfO_2$ or $Ta_2O_5$ is not deformed by formation of the electrical isolation region.

11. The structure of claim 8, wherein a thickness of the layer of $Al_2O_3$, $HfO_2$ or $Ta_2O_5$ ranges from about 40 Å to about 150 Å.

12. The structure of claim 8, wherein the semiconducting layer comprises silicon and wherein the isolation region comprises a silicon oxide.

13. The structure of claim 8, wherein the semiconducting layer comprises silicon and wherein the isolation region is formed using a local oxidation of silicon (LOCOS) technique.

14. A method of forming an electrical isolation region in a semiconductor substrate, comprising:
    forming a first layer of oxide over the semiconductor substrate;
    forming a layer of nitride over the first layer;
    forming a second layer of oxide over the nitride layer;
    forming a layer of $HfO_2$ or $Ta_2O_5$ over the second layer of oxide in a pattern, wherein the pattern exposes a portion of the semiconductor substrate; and
    locally oxidizing the exposed portion of the semiconductor substrate to form an electrical isolation region, wherein the isolation region does not substantially encroach an area beneath the layer of $HfO_2$ or $Ta_2O_5$.

15. The method of claim 14, wherein a thickness of the layer of $HfO_2$ or $Ta_2O_5$ ranges from about 40 Å to about 150 Å.

16. The method of claim 14, wherein the isolation region comprises a silicon oxide.

17. The method of claim 14, wherein the isolation region has a thickness ranging from about 200 Å to about 1500 Å.

18. A method, comprising:

forming a first layer of oxide directly on a layer of semiconducting material;

forming a layer of nitride directly on the first layer;

forming a second layer of oxide directly on the nitride layer;

forming a layer comprising one of $Al_2O_3$, $HfO_2$ or $Ta_2O_5$ directly on the second layer of oxide;

etching a pattern in the first layer of oxide, the nitride layer, the second layer of oxide and the layer comprising one of $Al_2O_3$, $HfO_2$ or $Ta_2O_5$ to expose one or more portions of the layer of semiconducting material; and oxidizing at least one of one or more exposed portions of the layer of semiconducting material to form an electrical isolation region.

19. The method of claim 18, where forming the layer comprising one of $Al_2O_3$, $HfO_2$ or $Ta_2O_5$ comprises:

forming the layer comprising one of $Al_2O_3$, $HfO_2$ or $Ta_2O_5$ directly on the second layer of oxide to a thickness ranging from about 40 Å to about 150 Å.

20. The method of claim 18, where the electrical isolation region has a thickness ranging from about 200 Å to about 1500 Å.

21. The method of claim 18, where the semiconducting material comprises silicon and wherein the isolation region comprises a silicon oxide.

22. The method of claim 18, where the semiconducting material comprises silicon and wherein the oxidizing comprises:

using a local oxidation of silicon (LOCOS) technique.

23. The method of claim 18, where the electrical isolation region does not substantially encroach a region beneath the first layer of oxide, the nitride layer, the second layer of oxide and the layer comprising one of $Al_2O_3$, $HfO_2$ or $Ta_2O_5$.

24. The method of claim 18, where the electrical isolation region does not substantially deform the first layer of oxide, the nitride layer, the second layer of oxide and the layer comprising one of $Al_2O_3$, $HfO_2$ or $Ta_2O_5$.

* * * * *